United States Patent [19]

Kreisel et al.

[11] 4,452,264
[45] Jun. 5, 1984

[54] RINSING OF ARTICLES TO REMOVE AN ADHERING SUBSTANCE

[75] Inventors: Rudolf Kreisel, Nuremberg; Walter Meyer, Berlin, both of Fed. Rep. of Germany

[73] Assignee: Schering Aktiengesellschaft, Berlin and Bergkamen, Fed. Rep. of Germany

[21] Appl. No.: 405,093

[22] Filed: Aug. 4, 1982

Related U.S. Application Data

[60] Division of Ser. No. 304,971, Sep. 23, 1981, which is a continuation-in-part of Ser. No. 829,255, Aug. 30, 1977, abandoned.

[30] Foreign Application Priority Data

Sep. 8, 1976 [DE] Fed. Rep. of Germany ....... 2640932

[51] Int. Cl.$^3$ .............................................. B08B 3/02
[52] U.S. Cl. ................... 134/58 R; 134/199
[58] Field of Search .............................. 134/58 R, 199

[56] References Cited

U.S. PATENT DOCUMENTS

| | | | |
|---|---|---|---|
| 2,270,642 | 1/1942 | Somes | 134/58 R |
| 3,665,941 | 5/1972 | Griparis | 134/58 R |
| 3,896,829 | 7/1975 | Sabatka | 134/58 R |
| 4,338,958 | 7/1982 | Fujita | 134/199 X |

*Primary Examiner*—Robert L. Bleutge
*Attorney, Agent, or Firm*—Michael J. Striker

[57] ABSTRACT

Articles which require the removal of an adhering substance, such as residue of a galvanizing bath, are rinsed by spraying an aqueous rinsing agent against them repeatedly. Each spraying interval is followed by a run-off interval during which the sprayed-on rinsing agent can run off the articles. The length of the run-off intervals is equal to, or greater than, the length of the spraying intervals.

8 Claims, 5 Drawing Figures

RINSING OF ARTICLES TO REMOVE AN ADHERING SUBSTANCE

CROSS REFERENCE TO RELATED APPLICATION

This is a division of application Ser. No. 304,971, filed Sept. 23, 1981 which in turn is a continuation-in-part of application Ser. No. 829,255 filed Aug. 30, 1977, abandoned.

BACKGROUND OF THE INVENTION

1. Field of Invention

The invention is concerned with removing adhering substances from articles which have undergone a chemical or electrochemical treatment, for example (but not exclusively) in galvanizing baths.

More particularly, the invention is concerned with a novel method of effecting such removal, an apparatus for carrying out the method, and an arrangement for the chemical or electrochemical treatment of articles which utilizes the apparatus.

2. The Prior Art

There are many chemical or electrochemical surface treatments, following which the treated articles must be freed of a substance adhering to them from the treatment, e.g., a bath residue. An important treatment of this type is the galvanizing treatment. For purposes of explanation the invention will hereafter be described with reference thereto, although it should be understood that it is not so limited.

During galvanization an article must be dipped into a series of galvanizing baths, each containing a substance for the active surface treatment of the article. It is almost always necessary to thoroughly remove from the article the adhering residue of the preceding bath before the article can be immersed in the subsequent bath. This rinsing of the articles between the successive galvanic treating stages is an important factor, both with respect to the quality of the finished product (improperly rinsed articles are not properly treated in subsequent stages) and to overall cost (this factor will be explained subsequently).

The rinsing agent thus employed is usually water. Such water may be drawn from a municipal water supply or it may be water that is recirculated in a closed system and processed in an ion-exchange installation.

Water received from the unicipal supply must be purchased by the user. Since this involves considerations of expense, it is desired to use as little such wateras possible, a requirement which is in contradiction to the conventional wisdom that the more water is used, the better will be the rinsing effect. Also, once the water has been used for rinsing it is enriched with the rinsed-off residue which is often of a poisonous character. Before such water can be discharged into a muncipal sewage system it must be neutralized or the poisonous substances must be removed. This, also, causes expenses which are added to those of purchasing the water in the first place; evidently, the more water is used for rinsing, the higher will be the overall costs.

If the rinsing water is recirculated in a closed system and processed in an ion-exchange installation, none or very little of the rinsing water will be lost. It is therefore possible to use as much rinsing water as desired. However, ion-exchange installations represent a very expensive investment and must be the larger, the more water is to be processed and also in dependence upon the types of concentrations of residual substances with which the water becomes enriched during rinsing of the articles.

As a general rule, the decision to use municipal water or to purchase a closed-circuit ion-exchange installation will be a question of economics. If it is possible to effect the necessary rinsing with only small quantities of water, then it is usually less expensive to purchase municipal water and to detoxify it before discharge into the sewage system (or before using it to compensate for evaporation losses of the treating bath or baths).

The problem is how to keep the required water quantity small. It is known that this is possible only if the water is enriched with the rinsed-off contaminants to as high a degree as possible before it must be detoxified and discharged or re-used. Several proposals have, in fact, been made in the prior art to achieve this purpose.

For example, it has been proposed to dip the articles into a container filled with rinsing water. Practical experience has shown that the required rinsing effectiveness cannot be achieved with a single rinsing container following each container of treating bath. It is therefore customary practice to arrange subsequent to each treating bath several rinsing containers which are usually connected in cascade form and wherein the water travels about the article to be rinsed. Water travel is in counterflow to the movement of the article from one into the next container, so that the water becomes progressively enriched with the residual (treating) substance that is being flushed from the article. This is then usually followed by a final container in which the article is allowed to soak in still water for a time. The previous practice has been to use three such containers arranged consecutively; more recently up to eight containers have been used and this has resulted in a noticeable decrease of the water requirement (since the adhering bath residue is removed more efficiently and a higher concentration of it can be achieved in the rinsing water before the same must be discharged). However, such an installation represents a substantial investment, particularly because cascading of the water is not practicable when so many containers are involved, so that the water must be pumped through the container series (which adds to the cost because it requires pumps, conduits, valves and energy to operate the pumps). In addition, there are certain process conditions (e.g. when rinsing is carried out subsequent to nickel plating) which do not permit the relatively long dwell time of the articles in the container that results from the use of a large number of such containers through which the articles must travel seriatim.

Another proposal in the prior art involves spraying rinse water against the articles, so as to flush away the adhering bath residue. This method is not uniformly suited for all types of articles; however, flat objects such as e.g. circuit boards or conductor plates can be well cleaned this way. The spray method does result in reduced water use and has the additional advantage of offering rapid and intimate mixing of the sprayed-on water with the ahering bath residue (this being a necessary condition for rapid and effective flushing-off of the residue). In the dip method, by contrast, it is usually considered necessary to blow air into the rinse water in the containers, in order to agitate the water and in this way to aid the residue removal. However, despite its advantages the spray method is not widely used because the required installations are relatively expensive and require an often unacceptable capital investment.

In summary, therefore, it can be said that the state of the art is in need of further improvement.

SUMMARY OF THE INVENTION

Accordingly, it is a general object of the invention to provide such improvements.

More particularly, it is an object of the invention to provide an improved method of rinsing articles so as to remove adhering substances from them.

Another object is to provide such a method which requires quantities of rinsing agent (e.g., water) that can be properly characterized as small or even extremely small, but which method will nevertheless achieve a high-grade thinning effect on the adhering substances (and thus their removal) in the briefest possible time.

An additional object is to provide an apparatus for carrying out the novel method.

Still a further object is to provide an apparatus for the chemical or electrochemical treatment of articles which employs the novel method.

In pursuance of these objects and of others which will become apparent hereafter, one aspect of the invention resides in a method of rinsing articles to remove an adhering substance, particularly subsequent to chemical or electrochemical surface treatment of the articles. Briefly stated, this method may comprise the steps of positioning an article to be rinsed in a confined space; spraying a rinsing agent onto the article for a first period of time; terminating the spraying and allowing the rinsing agent to run off the articles for a second period of time which is at least equal to said first period; and repeating the spraying and terminating steps.

An apparatus for carrying out the above method may comprise means bounding a rinsing chamber; means for supporting at least one article in said chamber; a plurality of spray nozzles arranged to direct sprays of a rinsing agent against the article in said chamber; and means for operating said spray nozzles intermittently and for deactivating them after each operation for a time interval whose duration is at least equal to the duration of the preceding spray operation.

The novel features which are considered as characteristic are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

The method and apparatus according to the invention will hereafter be described jointly with reference to the several Figures.

Figure 1:
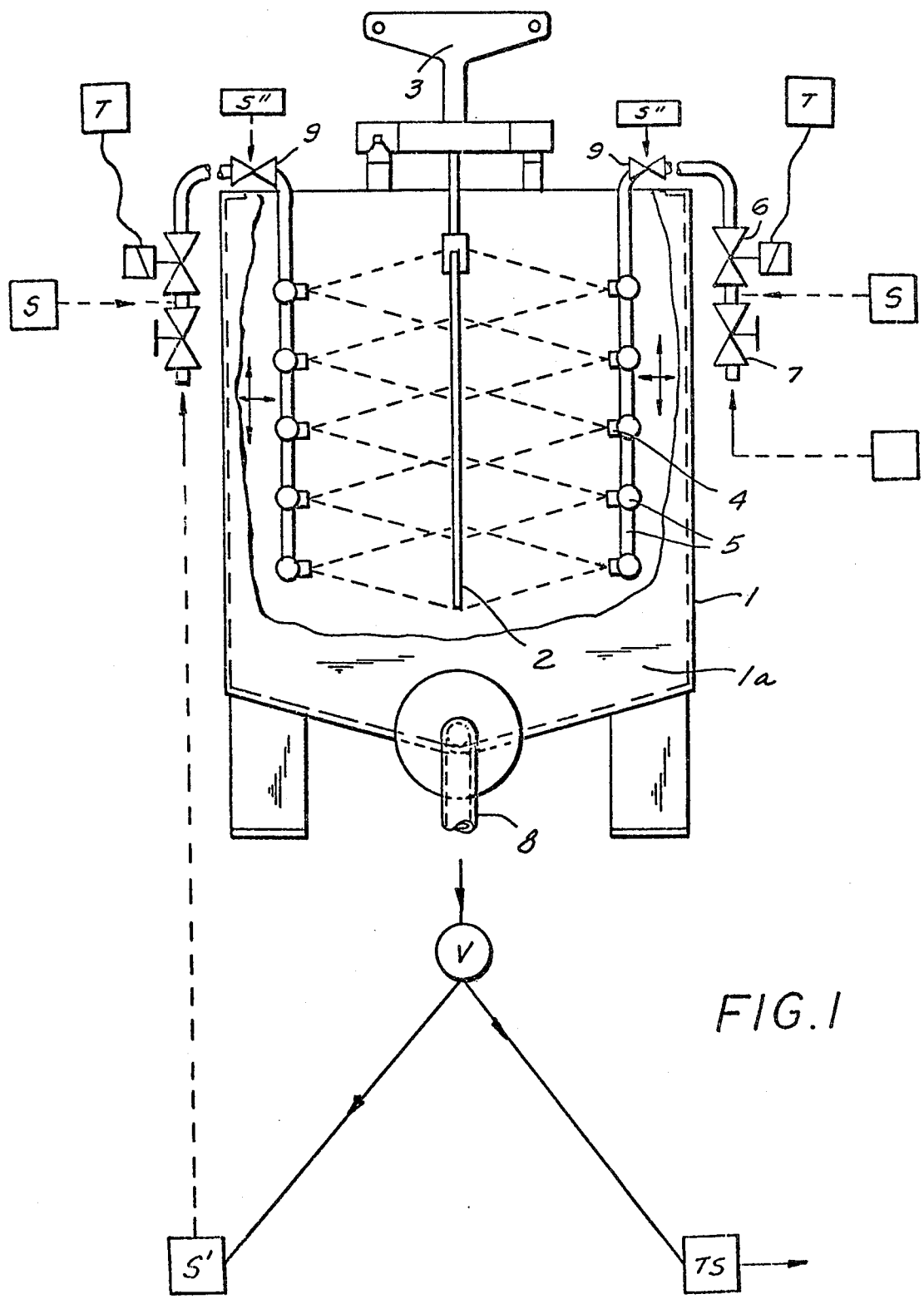
FIG. 1 is a diagrammatic vertical section through an apparatus embodying the invention.

Referring firstly to FIG. 1 it will be seen that this shows, in a diagrammatic vertical section, a container or vessel 1 having a rinsing chamber 1a. The article (or articles) 2 to be rinsed are positioned in the chamber 1a by means of a support or holder 3. The specific construction of holder 3 is of no consequence; all that is required of the holder is that it be capable of holding the article or articles in predetermined position.

Laterally of the article 2 (at opposite sides thereof) there are arranged pipes or conduits 5 which are provided with series or rows of spray nozzles 4. The pipes 5 are connected to the diagrammatically illustrated supply S of rinsing agent, e.g. a municipal water supply if water is used as the rinsing agent in accordance with usual practice.

Interposed in the pipes 5 are solenoid-valves 6 which are controlled by diagrammatically illustrated timers T. The timers T are adjustable and can be set to open the valves 6 for selectable different periods of time, depending upon the number (and/or type) of articles 2 to be rinsed in the chamber 1a. The sprays emitted from successive nozzles 4 of each row preferably overlap slightly when they impinge the article 2 (as shown) to assure proper removal of the adhering substances, e.g. residue of a treating bath in a galvanizing installation. The rinsing agent (e.g. water) or an aqueous solution and the rinsedoff residue run off together, collect at the bottom of chamber 1a and are withdrawn via the outlet conduit 8.

In operation, the timers T control the solenoid valves 6 in such a manner that rinsing agent sprays are emitted from the nozzles in a series of brief bursts each lasting between about 0.1 and 5 seconds, preferably 1.5 seconds. The time intervals between the successible bursts afford the rinsing agent and residue the opportunity to run (drip) off the article 2; these run-off intervals must be at least as long as the spray intervals and should preferably be longer. The run-off intervals may last between 1 and 10 seconds, preferably 5 seconds. The spray pressure should be about 2 to 6 bar, preferably 2.5 bar.

The spray pressure may be varied for different ones of the successive spray bursts and the length of all bursts may be uniform; this changes the amount of rinsing agent which are sprayed onto the article during the respective bursts. The same effect can also be achieved by maintaining the spray pressure uniform during all spray bursts but varying the length of different ones of these bursts (via timers T).

If desired, the run-off following the first spray burst of the rinsing operation may be supplied to a treating station TS where the rinsed-off bath residue may be recovered from the rinsing agent for re-use, or where other treatments may be performed. No details are given concerning the station T because its constructions and operation do not form part of the invention. The run-off from the succeeding spray-bursts may then be re-used, either for a first spray burst in the rinsing of the next article 2, or in general by accumulating these run-off quantities in a supply S' and then adding them to the pipes 5 via valves 7. In either case, the last spray-burst of the rinsing operation may be carried out with fresh rinsing agent (e.g. fresh water) and when this runs off it may be added to the recirculation path of the previously used rinsing agent to make up for the amount that is lost by discharging the run-off from the first spray burst to the station T. The distribution to the station T and the supply S', respectively, may be effected via a two-way valve V.

The spray bursts from the nozzles 4 of one row may be timed-delayed with reference to the spray bursts from the nozzles of the other row and/or the positions of the nozzles 4 relative to the article 2 may be varied, e.g. by moving the pipes 5, as indicated by the arrows. Any suitable device may be used to effect such movement and the pipe sections carrying the nozzles 4 may be connected to the remainder of the pipes 5 via elastic hoses or the like to permit such movement.

Subsequent to the final spray burst and run-off, liquid still adhering to the articles 2 may be removed by a blast of gaseous fluid, e.g. air. For this purpose the nozzles 4 may be connected via valves 9 with a source S" of compressed gas.

The apparatus of FIG. 1 may be employed as part of an arrangement or apparatus for the chemical or electrochemical surface treatment (e.g. galvanizing) of articles 2.

Figure 2:
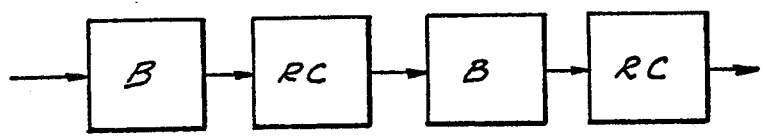
FIG. 2 is a diagrammatic top plan view, illustrating the invention embodied in an apparatus for the chemical or electrochemical treatment of articles.

For example, FIG. 2 shows diagrammatically that each container or bath B of active treating liquid used in a galvanizing process may be followed by a rinsing container RC which is constructed and operates in the manner described with reference to FIG. 1.

Figure 3:
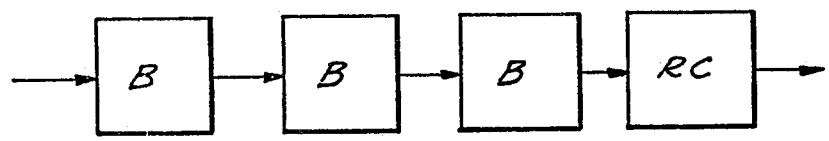
FIG. 3 is a view similar to FIG. 2 but illustrating a modification.

If it is not important to remove the residue of each preceding bath B before the article enters the succeeding bath B, then a rinsing container RC may be arranged only after several of the baths B, for example (but not necessarily) on the last container of a series. This is shown in FIG. 3.

Figure 4:
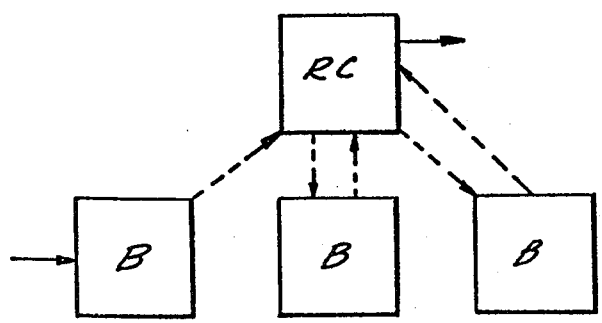
FIG. 4 is another top plan view, illustrating a further modification as compared to FIG. 2.

FIG. 4 shows that a rinsing container RC may also be located laterally of a row of treating baths B to service all of them. As indicated by the arrows, the article 2 (not shown) would be transported to and rinsed in the rinsing container RC after every treating bath B and prior to immersion in the next bath B of the series. Of course, the container RC need not be located laterally, of the series of baths B even under these circumstances; it could be arranged within the row of baths.

Figure 5:
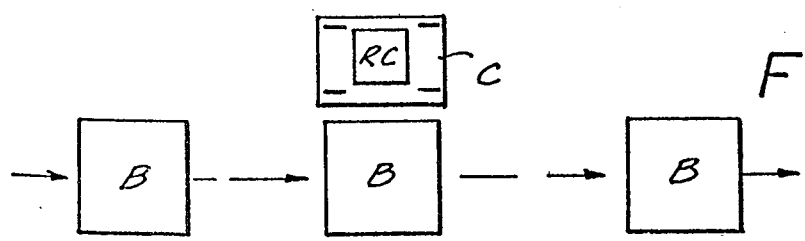
FIG. 5 is a view analogous to FIG. 4 but illustrating still another modification.

Finally, FIG. 5 shows that the rinsing container RC may be mounted on a carriage C (e.g., of the wheeled type or on a crane or the like) and be moved along a row of baths B to service the same. Instead of transporting the articles from each bath to the stationary container RC as in FIG. 4, the container RC would then move to each bath to receive respective articles from the same and could deliver the rinsed articles to the next-following bath. The carriage (if of the wheeled type) could be provided with an engine or motor to move it, or it could be moved by e.g., fluid-operated cylinder-and-piston units.

If the articles 2 are small and a plurality of them is treated together, e.g., in a galvanizing drum, the apparatus of FIG. 1 and the method disclosed herein are also applicable. The apparatus of FIG. 1 could then be modified to be provided (in lieu of the illustrated pipes 5) with one or more pipes that can be inserted into the interior of the galvanizing drum so as to rinse the articles contained in the same. The drum itself could be placed into the chamber 1a.

The invention makes it possible to reduce the required quantities of rinsing agent to an extremely low level, as compared to the prior art. For example, even if only two successive spray bursts are used, the bath residue adhering to the article will be satisfactorily flushed off (and be diluted more than 900-fold) with the use of only 1.4 liter of rinsing agent per square meter surface area of the article 2. If three spray bursts are used, the adhering bath residue will be diluted more than 20,000 times while the total amount of rinsing agent required rinses only slightly, namely to 2.1 liter per square meter of article surface area.

In galvanizing processes it is sufficient if the bath residue remaining on the article is diluted about 1000-fold, before the article is immersed into the next galvanizing bath. It is clear, therefore, that if the invention is used in conjunction with a galvanizing process, the amount of rinsing agent required to obtain a satisfactory rinsing (dilution) are extremely small. This, in turn, makes it economically feasible to treat the entire quantity of rinsing agent (or, as mentioned earlier, only the run-off from the first spray burst) in order to recover from it the bath residue with which it becomes enriched, so that the bath residue can be re-used to reduce costs.

The invention will be further explained on hand of the following

EXAMPLE I

Conductor plates having a total surface area of 1.08 square meters and provided with a plurality of holes having diameters between 1 and 6 mm, were treated with an aqueous solution of sodium hydroxide (22 grams of NaOH per liter. They were then removed from the solution and allowed to drip for 10 seconds. At the end of that time it was found that 70 milliliters of solution remained on the plates per square meter of surface area. The plates were then rinsed in the apparatus of FIG. 1 under various conditions and the following results were measured:

| Test No. | Duration of intervals (in seconds) S = spray burst R = run-off time | | | | | | Rinsing water required (liter/m$^2$) | Dilution of NaOH solution on article surface | Dilution of rinsed-off NaOH concentrate |
| --- | --- | --- | --- | --- | --- | --- | --- | --- | --- |
|  | S | R | S | R | S | R |  |  |  |
| 1 | 3 |   |   |   |   | 10 | 1.4 | 400-fold | 20-fold |
| 2 | 1.5 | 5 | 1.5 |   |   | 10 | 1.4 | 900-fold | 20-fold |
| 3 | 1.5 | 5 | 1.5 | 5 | 1.5 | 10 | 2.1 | 20000-fold | 30-fold |

The spray bursts from the row of nozzles at one side of the chamber were time-delayed so as to impinge the articles only subsequently to impingement thereon of the spray bursts from the row of nozzles at the other side of the chamber.

These tests clearly show that the invention achieves highly satisfactory results with extremely small quantities of rinsing agent. It is important to note, in this connection, that test No. 2 (in which spraying was carried out at intervals in accordance with the invention) produced a dilution of the NaOH residue on the articles which was more than twice as good as the dilution obtained in test No. 1 (where the interval spraying method according to the invention was not used), but required only the same amount of rinsing agent as did test No. 1. Test No. 3, requiring only slightly more rinsing agent than test No. 1, produced results which were fifty times better than those achieved with test No. 1.

EXAMPLE II

Rinsing tests were performed, wherein a running off process follows the rinsing process, whereby the running off process in accordance with the application takes the same time or longer than the rinsing process, or wherein the running off process is shorter than the rinsing process corresponding to the state of the art, compare U.S. Pat. No. 3,316,925 (Schroeder) and U.S. Pat. No. 3,673,042 (Mayers).

The texts were performed with the rinsing chamber described in the application. Conduct plates were used as articles to be rinsed with a total surface of 1.08 $m^2$ which were provided with a plurality of bores with diameters of 1 to 6 mm. The plates were first treated with a watery sodium hydroxide solution (22 g/l NaOH), whereby after a draining time of 10 secoonds a delayed quantity of 70 ml/$m^2$ were measured. Subsequently, the plates were rinsed in the rinsing chamber under different conditions and the results stated in the table were measured.

| | (A) Double-Cycle | | | | | | |
|---|---|---|---|---|---|---|---|
| | Duration of the processes (seconds) | | | | Consumption of rinse water | Dilution degree on the | Dilution degree of the rinsed NaOH-con- |
| Test No | Rinsing | Draining | Rinsing | Draining | (Liter/$m^2$) | plate surface | centrate |
| | According to state of the art | | | | | | |
| 1 | 1,5 | 1,0 | 1,5 | 1,0 | 1,4 | 440-times | 20-times |
| | According to application | | | | | | |
| 2 | 1,5 | 1,5 | 1,5 | 1,5 | 1,4 | 550-times | 20-times |
| 3 | 1,5 | 3,0 | 1,5 | 3,0 | 1,4 | 700-times | 20-times |
| 4 | 1,5 | 5,0 | 1,5 | 5,0 | 1,4 | 900-times | 20-times |

| | (B) Triple-Cycle | | | | | | | | |
|---|---|---|---|---|---|---|---|---|---|
| | Duration of the processes (seconds) | | | | | | Consumption of rinse water | Dilution degree on the plate | Dilution degree of the rinsed NaOH- |
| Test No. | Rinsing | Draining | Rinsing | Draining | Rinsing | Draining | (Liter/$m^2$) | surface | concentrate |
| | According to the state of the art | | | | | | | | |
| 5 | 1,5 | 1,0 | 1,5 | 1,0 | 1,5 | 1.0 | 2,1 | 800-times | 30-times |
| | According to application | | | | | | | | |
| 6 | 1,5 | 1,5 | 1,5 | 1,5 | 1,5 | 1,5 | 2,1 | 4000-times | 30-times |
| 7 | 1,5 | 3,0 | 1,5 | 3,0 | 1,5 | 3,0 | 2,1 | 7000-times | 30-times |
| 8 | 1,5 | 5,0 | 1,5 | 5,0 | 1,5 | 5,0 | 2,1 | 20000-times | 30-times |

It is clear, therefore, that the invention fully meets the earlier outlined objectives, in that it produces highly satisfactory results with extremely small quantities or rinsing agent.

While the invention has been illustrated and described as embodied in an apparatus for rinsing galvanically treated articles, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

We claim:

1. Apparatus for rinsing articles to remove an adhering substance, particularly subsequent to chemical or electrochemical surface treatment of the articles, comprising means bounding a rinsing chamber; means for supporting at least one article in said chamber; a plurality of spray nozzles arranged to direct sprays of a rinsing agent against the article in said chamber; and means for operating said spray nozzles intermittently and for deactivating them after each operation for a time interval whose duration is at least substantially equal to or greater than the duration of the preceding spray operation.

2. Apparatus as defined in claim 1; and further comprising a carriage mounting said means and said nozzles for transportation.

3. Apparatus as defined in claim 1, said operating means comprising electromagnetic valves which control the flow of rinsing agent to said nozzles, and timer means controlling the operation of said valves.

4. In an apparatus for the chemical or electrochemical treatment of articles, a combination comprising means defining a series of successive treating baths for the articles; and rinsing means for rinsing adhering bath material from the articles, comprising a rinsing station including means bounding a rinsing chamber; means for supporting at least one article in said chamber; a plurality of spray nozzles arranged to direct sprays of a rinsing agent against the article in said chamber; and means for operating said spray nozzles intermittently and for deactivating them after each operation for a time interval whose duration is at least equal to the duration of the preceding spray operation.

5. A combination as defined in claim 4, said rinsing means comprising a plurality of said rinsing stations, each arranged subsequent to a respective treating bath.

6. A combination as defined in claim 4, said rinsing station being arranged subsequent to at least some of the treating baths of said series.

7. A combination as defined in claim 4, said treating baths being arranged in a row, and said rinsing station being located laterally of said row to act as a central rinsing station for all of said baths.

8. A combination as defined in claim 4, said treating baths being arranged in a row, and said rinsing station being interposed in said row and constituting a central rinsing station for all of said baths.

* * * * *